United States Patent
Zheng et al.

(10) Patent No.: US 10,162,199 B2
(45) Date of Patent: Dec. 25, 2018

(54) WAVELENGTH-TUNABLE III-V/SI HYBRID OPTICAL TRANSMITTER

(71) Applicant: Oracle International Corporation, Redwood Shores, CA (US)

(72) Inventors: Xuezhe Zheng, San Diego, CA (US); Ying Luo, San Diego, CA (US); Jin Yao, San Diego, CA (US); Ashok V. Krishnamoorthy, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 163 days.

(21) Appl. No.: 15/357,358

(22) Filed: Nov. 21, 2016

(65) Prior Publication Data

US 2018/0143461 A1 May 24, 2018

(51) Int. Cl.
| | |
|---|---|
| *G02F 1/01* | (2006.01) |
| *H01S 5/125* | (2006.01) |
| *H01S 5/10* | (2006.01) |
| *G02B 6/28* | (2006.01) |
| *G02B 6/293* | (2006.01) |
| *H01S 5/50* | (2006.01) |
| *H01S 5/30* | (2006.01) |
| *H01S 5/06* | (2006.01) |

(52) U.S. Cl.
CPC ............ *G02F 1/011* (2013.01); *G02B 6/2808* (2013.01); *G02B 6/29338* (2013.01); *H01S 5/0612* (2013.01); *H01S 5/1071* (2013.01); *H01S 5/125* (2013.01); *H01S 5/3013* (2013.01); *H01S 5/50* (2013.01); *G02F 2203/15* (2013.01); *G02F 2203/70* (2013.01)

(58) Field of Classification Search
CPC ........ G02F 1/011; H01S 5/1071; H01S 5/125; H01S 5/0612; H01S 5/50; H01S 5/3013; G02B 6/29338; G02B 6/2808
See application file for complete search history.

(56) References Cited

U.S. PATENT DOCUMENTS

| | | | | |
|---|---|---|---|---|
| 7,664,156 B2 * | 2/2010 | Yamazaki | ............. | H01S 5/0612 372/34 |
| 7,962,045 B2 * | 6/2011 | McCallion | ......... | G02B 6/12007 398/185 |

* cited by examiner

*Primary Examiner* — Ryan Lepisto
(74) *Attorney, Agent, or Firm* — Park, Vaughan, Fleming & Dowler LLP (57) ABSTRACT

An optical transmitter includes a reflective semiconductor optical amplifier (RSOA) coupled to an input end of a first optical waveguide. An end of the first optical waveguide provides a transmitter output for the optical transmitter. Moreover, a section of the first optical waveguide between the input end and the output end is optically coupled to a ring modulator that modulates an optical signal based on an electrical input signal. A passive ring filter (or a 1×N silicon-photonic switch and a bank of band reflectors) is connected to provide a mirror that reflects light received from the second optical waveguide back toward the RSOA to form a lasing cavity. Moreover, the ring modulator and the passive ring filter have different sizes, which causes a Vernier effect that provides a large wavelength tuning range for the lasing cavity in response to tuning the ring modulator and the passive ring filter.

10 Claims, 7 Drawing Sheets

WAVELENGTH-TUNABLE III-V/SI HYBRID OPTICAL TRANSMITTER

GOVERNMENT LICENSE RIGHTS

This invention was made with U.S. government support under Agreement No. HR0011-08-9-0001 awarded by DARPA. The U.S. government has certain rights in the invention.

FIELD

The disclosed embodiments relate to the design of a tunable optical transmitter. More specifically, the disclosed embodiments relate to the design of a wavelength-tunable hybrid III-V/Si optical transmitter.

RELATED ART

Silicon photonics is a promising new technology that can provide large communication bandwidth, low latency and low power consumption for inter-chip and intra-chip connections or optical links. In order to achieve low-latency, high-bandwidth optical connectivity, a number of optical components are required, including: optical transmitters, optical detectors, optical multiplexers, optical demultiplexers and lasers.

Figure 1:
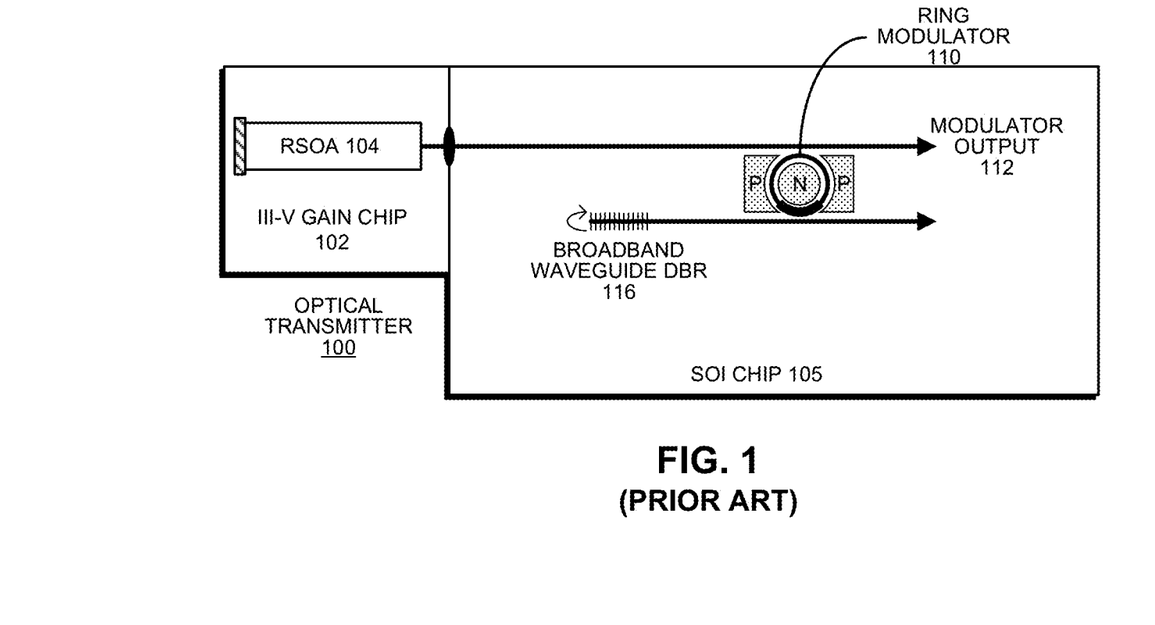
FIG. 1 illustrates a prior art optical transmitter.

A number of high-performance optical transmitters have recently been developed. For example, FIG. 1 illustrates the design of a III-V/Si hybrid optical transmitter 100 that requires only minimized ring tuning and is fabricated using an intra-laser-cavity silicon ring modulator 110. (See Tomoyuki Akiyama, Shinsuke Tanaka, Teruo Kurahashi, Hiroji Ebe, and Shigeaki Sekiguchi, "A novel transmitter leveraging high-speed ultralow-power modulation of a Si microring modulator by eliminating tuning power," OFC 2016, M2C.4, 2016.) The lasing cavity of the laser in this optical transmitter is formed by the high-reflectivity facet of a III-V gain chip 102, which includes a reflective semiconductor optical amplifier (RSOA) 104, and a silicon-on-insulator (SOI) chip 105, which includes a silicon broadband waveguide distributed Bragg reflector (DBR) 116. By using asymmetric ring couplings, which are critically coupled for the modulation output, and are under-coupled for the monitor output, a small resonance shift by the ring modulator results in insignificant cavity loss change while providing a substantial output optical power change at the modulator output port 112 when the ring resonance is aligned to the lasing cavity mode. Moreover, the lasing wavelength of the lasing cavity will be the mode closest to the ring resonance within the band of the broadband waveguide DBR 116. Although the exact ring resonance is not known before fabrication due to manufacturing variations, the modulator ring only needs to be tuned to its nearest cavity mode (typically on a spacing of a few tenths of a nanometer), which means that minimal ring tuning is required.

In spite of the advantages of the optical transmitter illustrated in FIG. 1, a number of challenges remain to make such an optical transmitter practical. In theory, the wavelength of the transmitter can be adjusted by tuning the ring resonance. However, the tuning range is limited by the grating band reflector designed with a reflection band slightly smaller than the free spectral range (FSR) of the ring resonator. In addition, the thermo-optic coefficient (TOC) difference between the III-V gain material and SOI silicon waveguides, can cause "walk-offs" between the hybrid cavity mode and the ring resonance. Consequently, a complicated active closed-loop feedback control system is required for stable transmitter operation during ambient temperature changes.

Hence, what is needed is a high-performance optical transmitter that overcomes the above-described challenges.

SUMMARY

The disclosed embodiments provide an optical transmitter that includes a reflective semiconductor optical amplifier (RSOA), which is coupled to a first optical waveguide, which has an input end and an output end, wherein the input end is coupled to the RSOA, the output end provides a transmitter output for the optical transmitter, and a section of the first optical waveguide between the input end and the output end is optically coupled to a ring modulator that modulates an optical signal based on an electrical input signal. The optical transmitter also includes a passive ring filter optically coupled to the second optical waveguide. This passive ring filter is configured to provide a mirror that reflects light received from the second optical waveguide back toward the RSOA to form a lasing cavity, wherein the lasing cavity includes the RSOA, the first optical waveguide, the ring modulator, the second optical waveguide and the passive ring filter. Moreover, the ring modulator and the passive ring filter have different sizes, which causes a Vernier effect that provides a large wavelength tuning range for the lasing cavity in response to tuning the ring modulator and the passive ring filter.

In some embodiments, the lasing cavity includes a thermo-optic coefficient (TOC) compensator comprising a section of compensation material. In these embodiments, the lasing cavity includes a length $l_{Si}$ through silicon, a length $l_C$ through the compensation material, and a length $l_{OGM}$ through the optical gain material, wherein the effective refractive index of silicon is $n_{Si}$, the effective refractive index of the compensation material is $n_C$, and the effective refractive index of the optical gain material is $n_{OGM}$. Moreover, the effective TOC of silicon is $dn_{Si}/dT$, the effective TOC of the compensation material is $dn_C/dT$, and the effective TOC of the optical gain material is $dn_{OGM}/dT$. Finally, $l_C \approx l_{OGM} * (dn_{OGM}/dT - dn_{Si}/dT)/(dn_{Si}/dT - dn_C/dT)$, whereby the effective TOC of a portion of the lasing cavity that passes through the optical gain material and the compensation material is substantially the same as the TOC of silicon.

In some embodiments, the second optical waveguide is coupled to a Y-junction, which splits the light received from the second optical waveguide between a third optical waveguide and a fourth optical waveguide that pass along opposite sides of the passive ring filter, whereby the passive ring filter functions as a ring mirror that reflects the light back toward the RSOA to form the lasing cavity.

In some embodiments, the second optical waveguide is optically coupled to the passive ring filter, and the passive ring filter is optically coupled to a third optical waveguide, which is coupled to a broadband waveguide distributed Bragg reflector (DBR), whereby the broadband waveguide DBR reflects light received from the third optical waveguide back toward the RSOA to form the lasing cavity.

In some embodiments, the second optical waveguide is optically coupled to the passive ring filter, and the passive ring filter is optically coupled to a waveguide loop mirror that reflects the light received from the passive ring filter back toward the RSOA to form the lasing cavity.

In some embodiments, the RSOA is located on a III-V gain chip, which is separate from a silicon-on-insulator (SOI) chip that includes the ring modulator, the first and second optical waveguides, the passive ring filter and other components of the optical transmitter.

In some embodiments, the ring modulator and the passive ring filter are both tuned to have resonances aligned with a Fabry-Pérot cavity mode within a gain bandwidth of the RSOA.

In some embodiments, the ring modulator and the passive ring filter include thermal tuning mechanisms.

The disclosed embodiments also provide another optical transmitter that includes a reflective semiconductor optical amplifier (RSOA), which is coupled to a first optical waveguide, which has an input end and an output end, wherein the input end is coupled to the RSOA, the output end provides a transmitter output for the optical transmitter, and a section of the first optical waveguide between the input end and the output end is optically coupled to a ring modulator that modulates an optical signal based on an electrical input signal. The optical transmitter also includes an array of N narrow-band reflectors, wherein each narrow-band reflector has a different center wavelength, and a 1×N silicon-photonic switch, having an input port and N output ports, wherein each output port is coupled to a different narrow-band reflector in the array of N narrow-band reflectors. The optical transmitter additionally includes a second optical waveguide with a first end optically coupled to the ring modulator and a second end coupled to the input port of the 1×N silicon-photonic switch. Finally, the optical transmitter includes an adjustment mechanism that facilitates adjusting a frequency of the optical transmitter in discrete increments by selectively coupling the input port of the 1×N silicon-photonic switch to one of the N output ports. This causes the RSOA, the first optical waveguide, the ring modulator, the second optical waveguide and the 1×N silicon-photonic switch to form a lasing cavity with a narrow-band reflector coupled to the selected output port of the 1×N silicon-photonic switch, wherein the lasing cavity has a wavelength that is determined by the center wavelength of the selected narrow-band reflector.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Implementation

In this specification, we describe a novel fast-tunable silicon hybrid laser source. This laser source combines a III-V gain medium integrated with an SOI silicon circuit, which includes a silicon ring modulator and a larger sized passive-ring filter (or, alternatively, a 1×N silicon-photonic switch and a bank of band reflectors), to produce a tunable transmitter with a broad wavelength tuning range, fast tuning speed and accurate channel spacing. In addition, by using an intra-cavity thermo-optic coefficient (TOC) compensator, this tunable III-V/Si hybrid transmitter can operate without requiring closed-loop control.

Figure 2:
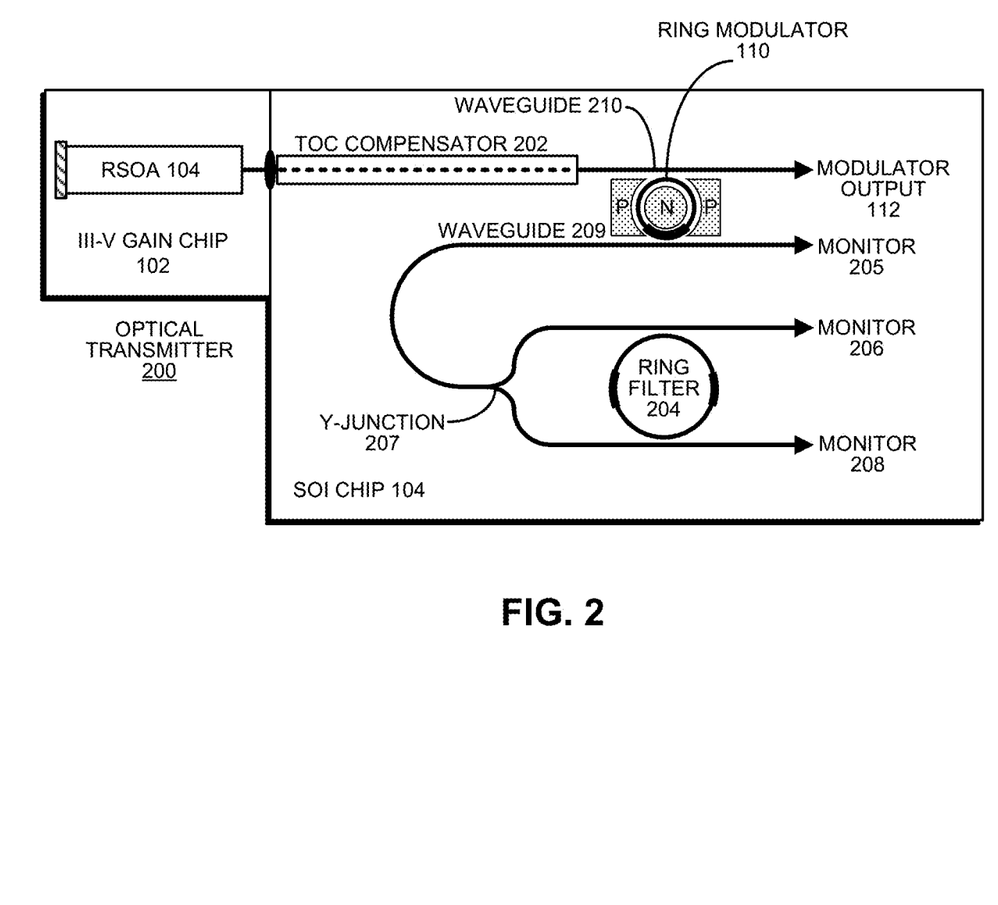
FIG. 2 illustrates an optical transmitter that includes a ring modulator and passive ring filter, which functions as a ring mirror reflector for the lasing cavity in accordance with the disclosed embodiments.

More specifically, FIG. 2 illustrates the design of a widely tunable III-V/Si hybrid optical transmitter 200. This optical transmitter 200 includes an RSOA 104, which resides within a III-V gain chip 102, and is coupled to an SOI chip 105 that includes an SOI reflector circuit comprising a TOC compensator 202, a high-speed ring modulator 110 with asymmetric couplings, and a ring mirror comprising a Y-junction 207 coupled to a tunable ring filter 204. The illustrated configuration creates a hybrid lasing cavity between the HR facet of the RSOA 104 and the ring mirror. Note that optical transmitter 200 also includes a number of monitor ports 205, 206 and 208. Also note that ring modulator 110 is designed with asymmetric coupling to its two bus waveguides. This asymmetric coupling is under-coupled to a bottom bus waveguide 209, which is connected to a monitor port 205, and critically coupled to a top bus waveguide 210, which is connected to a modulator output 112. This system also uses a different sized ring for the ring filter 204 as compared with the ring in the ring modulator 110 to create a Vernier effect.

During operation, both the ring filter 204 and the ring modulator 110 are tuned to have their resonances aligned with one of the Fabry-Pérot cavity modes within the gain bandwidth of RSOA 104. Through asymmetric coupling to bus waveguides 209 and 210, a small resonance dithering of ring modulator 110 will generate a large extinction modulation to the optical power output at the critically coupled bus waveguide 210, while maintaining a relatively stable optical field inside of the laser cavity. Note that ring modulator 110 effectively acts as an energy reservoir that stores energy inside in the "0" output state and releases energy in the "1" output state.

By tuning both ring modulator 110 and ring filter 204, different lasing wavelengths can be achieved much beyond the FSR of either ring modulator 110 or ring filter 204 using the Vernier effect. Note that without using a cavity phase tuner, only a discrete set of lasing wavelengths can be achieved where the cavity modes of the hybrid cavity are positioned. However, by exploiting the Vernier effect, a large wavelength tuning range can be achieved with only one full FSR tuning required for each ring. However, even single FSR tuning requires about 10s of milliwatts of tuning power. Moreover, in practical communication links, only discrete wavelength channels with pre-determined channel spacings are used. Hence, a large passive ring filter 204 can be designed with an FSR equal to the channel spacing to eliminate full FSR tuning. During operation, both the ring modulator 110 and the passive ring filter 204 are tuned to have a resonance aligned with a laser cavity mode of interest. The maximum amount of required tuning is reduced to one full FSR for the ring modulator 110 and one laser cavity-mode-spacing for the large ring filter 204.

Because of different TOCs of silicon and the III-V gain material, the position of the laser cavity modes will drift at a different rate from those of the ring resonances when the ambient temperature changes. This can cause "walk-offs" between the aligned ring resonances and the lasing cavity mode if the ambient temperature changes, which will result in mode-hopping that is fatal to high-speed communication links. Normally, an active closed-loop feedback control system is required for the rings to avoid such mode-hopping. However, adding a simple TOC compensator 202 with the right length to the lasing cavity can eliminate this temperature-induced mode-hopping effectively. (See U.S. patent application Ser. No. 15/292,501, entitled "Surface-Normal Optical Coupling Interface with Thermal-Optic Coefficient Conversion," by inventors Ying L. Luo, Xuezhe Zheng and Ashok V. Krishnamoorthy, filed 13 Oct. 2016, which is incorporated by reference herein.) Note that TOC compensator 202 can be implemented using a SiON waveguide (or another material with a thermo-optic coefficient lower than silicon) with proper low-loss transition to the silicon waveguides. Assume the effective lengths of the three materials Si, SiON and III-V in the hybrid cavity are $L_1$, $L_2$, and $L_3$, their refractive indices are $n_1$, $n_2$, and $n_3$, and their thermo-optic coefficients are $dn_1/dT$, $dn_2/dT$ and $dn_3/dT$, respectively. The changes in optical path length of the cavity mode $\Delta nL$ due to temperature variation $\Delta T$ can be expressed as $$\Delta nL = (dn_1/dT * L_1 + dn_2/dT * L_2 + dn_3/dT * L_3) * \Delta T.$$

We can make the average do/dT of the hybrid cavity equal to $dn_1/dT$ by choosing $$L_2 = (dn_3/dT - dn_1/dT)/(dn_1/dT - dn_2/dT) * L_3.$$

By using this design for TOC compensator 202, the cavity modes will drift at the same pace as the silicon filter. Hence, once the initial alignment is done, no further active tuning control is required to keep the hybrid laser from mode-hopping due to TOC mismatch.

Figure 3A:
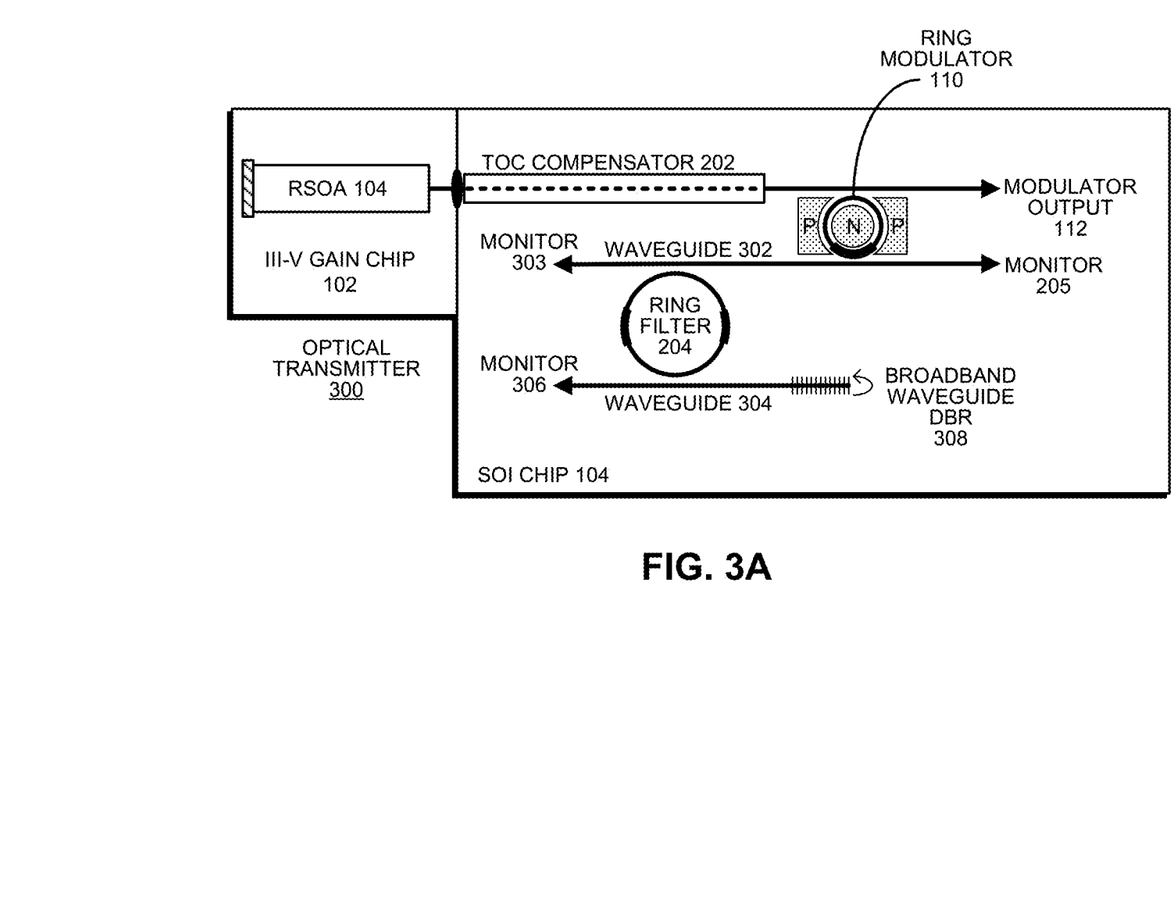
FIG. 3A illustrates an optical transmitter that includes a ring modulator, a passive ring filter and a broadband waveguide grating DBR that functions as a reflector for the lasing cavity in accordance with the disclosed embodiments.

Another embodiment of an optical transmitter 300 is illustrated in FIG. 3A. In this embodiment, ring modulator 110 is optically coupled to ring filter 204 through an intervening waveguide 302, which provides an additional monitor port 303. Ring filter 204 is also optically coupled to another waveguide 304, which includes a monitor port 306 and also a broadband waveguide DBR 308 that acts as a mirror for the lasing cavity.

Figure 3B:
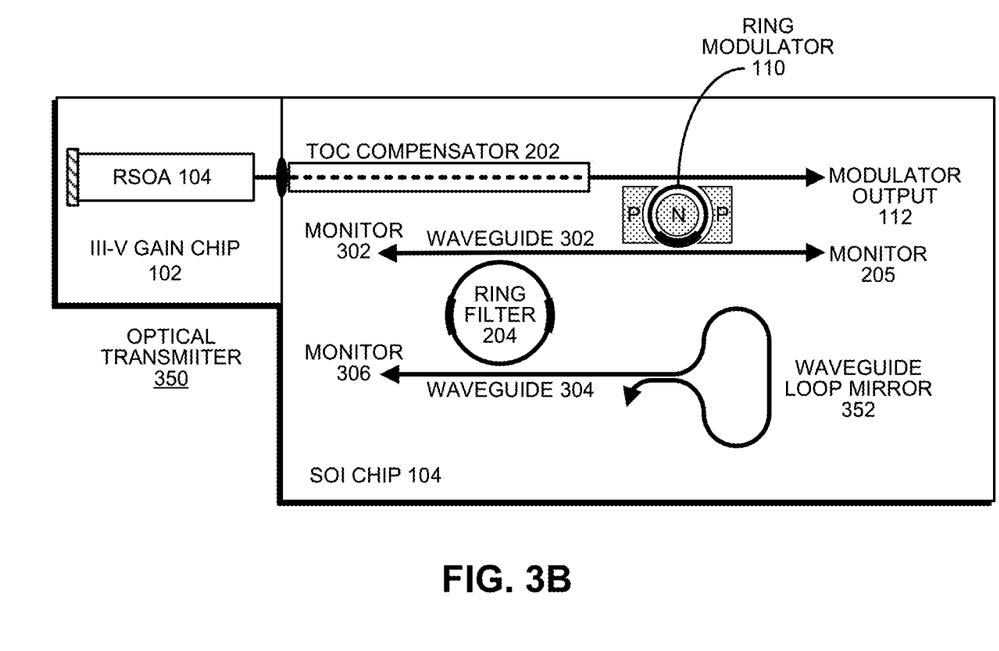
FIG. 3B illustrates an optical transmitter that includes a ring modulator, a passive ring filter and a waveguide loop mirror that functions as a reflector for the lasing cavity in accordance with the disclosed embodiments.

Yet another embodiment of an optical transmitter 350 is illustrated in FIG. 3B. This embodiment is similar to the embodiment illustrated in FIG. 3A, except that waveguide 304 is optically coupled to a waveguide loop mirror 352, which acts as a mirror for the lasing cavity.

Figure 4:
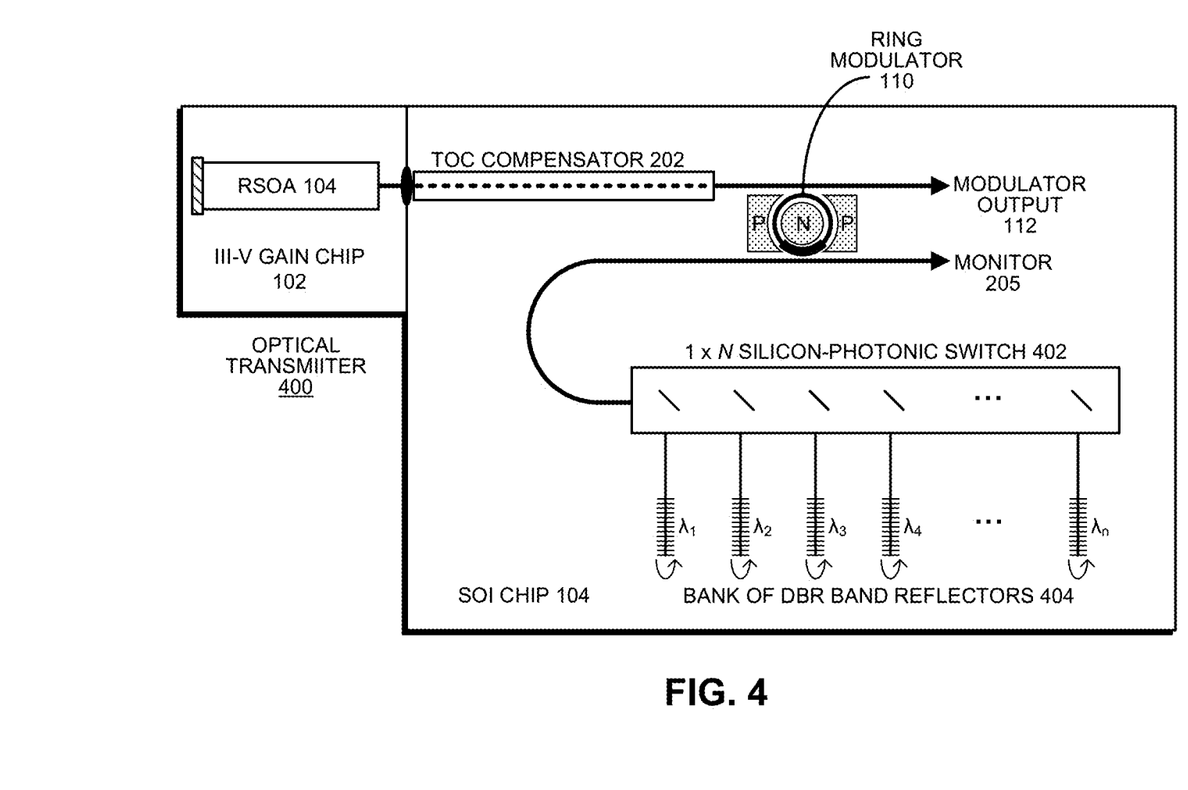
FIG. 4 illustrates an optical transmitter that includes a ring modulator, a passive ring filter, a 1×N silicon-photonic switch and an array of N narrow-band reflectors that can be selected to function as reflectors for the lasing cavity in accordance with the disclosed embodiments.

Finally, another embodiment illustrated in FIG. 4 uses a 1×N silicon-photonic switch 402 and a bank of DBR band reflectors 404 to replace the ring filter 204. This results in a fast-tunable III-V/Si hybrid transmitter with a large wavelength range and minimized ring tuning. (For a description of the 1×N MEMS switch, see Tae Joon Seok, Niels Quack, Sanyoon Han, Richard S. Muller, and Ming C. Wu, "High scalable digital silicon photonic MEMS switches," JLT 34 (2) 365-371, 2016.) More specifically, referring to FIG. 4, the 1×N silicon-photonic switch 402 is placed inside of the hybrid laser cavity with its input port connected to the ring modulator 110, and its output ports connected to the bank of silicon waveguide DBR band reflectors 404, which have identical reflection bands that are slightly smaller than the ring FSR, and have center wavelengths consecutively spaced one ring-FSR away from each other. Note that when the lasing cavity is connected to one of the DBR band reflectors, there is one and only one ring resonance within the reflection band. Hence, the ring modulator 110 only needs to be tuned to the cavity mode closest to that resonance order. Also, because the cavity mode spacing is typically an order of magnitude smaller than the ring FSR, the ring tuning is minimized. Moreover, by using a TOC compensator 202 in the cavity, no active closed-loop ring control is required to prevent mode-hopping caused by temperature changes. This design also makes it possible to pre-calibrate the amount of ring tuning required for fine alignment with the cavity modes for different wavelength channels, and to achieve fast open-loop wavelength channel switching.

Operation

Figure 5:
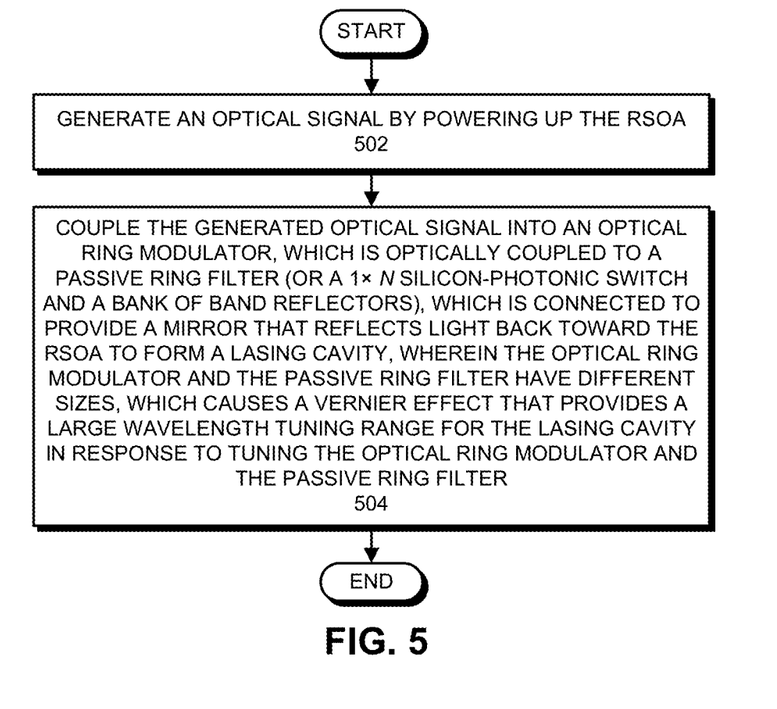
FIG. 5 present a flow chart illustrating actions performed during operation of the optical transmitter in accordance with the disclosed embodiments.

During operation, the hybrid optical transmitter system described with respect to the embodiments discussed above operates as described in the flow chart that appears in FIG. 5. First, the system generates an optical signal by powering up the RSOA (step 502). Next, the system couples the generated optical signal into a ring modulator, which is optically coupled to a passive ring filter (or a 1×N silicon-photonic switch and a bank of band reflectors), which is connected to provide a mirror that reflects light back toward the RSOA to form a lasing cavity. Moreover, the ring modulator and the passive ring filter have different sizes. This causes a Vernier effect that provides a large wavelength tuning range for the lasing cavity in response to tuning the ring modulator and the passive ring filter (step 504).

System

Figure 6:
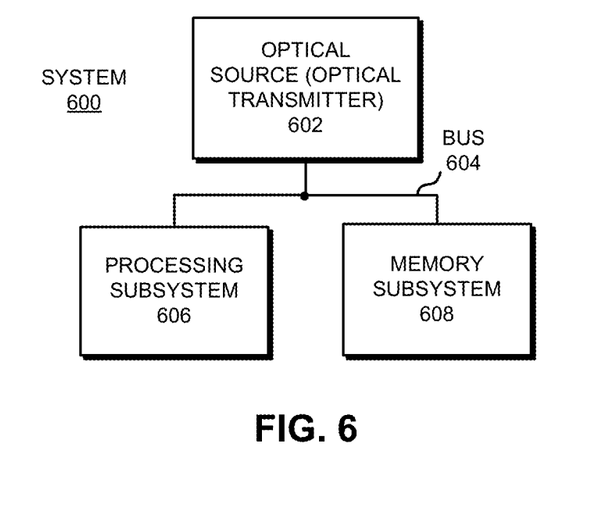
FIG. 6 illustrates a system that includes an optical source, such as an optical transmitter, in accordance with an embodiment of the present disclosure.

One or more of the preceding embodiments of the tunable laser may be included in a system or device. More specifically, FIG. 6 illustrates a system 600 that includes an optical source 602, which includes an optical transmitter. System 600 also includes a processing subsystem 606 (with one or more processors) and a memory subsystem 608 (with memory).

In general, components within optical source 602 and system 600 may be implemented using a combination of hardware and/or software. Thus, system 600 may include one or more program modules or sets of instructions stored in a memory subsystem 608 (such as DRAM or another type of volatile or non-volatile computer-readable memory), which, during operation, may be executed by processing subsystem 606. Furthermore, instructions in the various modules in memory subsystem 608 may be implemented in: a high-level procedural language, an object-oriented programming language, and/or in an assembly or machine language. Note that the programming language may be compiled or interpreted, e.g., configurable or configured, to be executed by the processing subsystem.

Components in system 600 may be coupled by signal lines, links or buses, for example bus 604. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 600 may be at one location or may be distributed over multiple, geographically dispersed locations.

System 600 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, optical source 602 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. An optical transmitter, comprising:
a reflective semiconductor optical amplifier (RSOA);
a ring modulator that modulates an optical signal based on an electrical input signal;
a first optical waveguide with an input end and an output end, wherein the input end is coupled to the RSOA, the output end provides a transmitter output for the optical transmitter, and a section of the first optical waveguide between the input end and the output end is optically coupled to the ring modulator;
a second optical waveguide optically coupled to the ring modulator; and
a passive ring filter optically coupled to the second optical waveguide;
wherein the passive ring filter is connected to provide a mirror that reflects light received from the second optical waveguide back toward the RSOA to form a lasing cavity, wherein the lasing cavity includes the RSOA, the first optical waveguide, the ring modulator, the second optical waveguide and the passive ring filter;
wherein the ring modulator and the passive ring filter have different sizes, which causes a Vernier effect that provides a large wavelength tuning range for the lasing cavity in response to tuning the ring modulator and the passive ring filter; and
wherein the second optical waveguide is coupled to a Y-junction, which splits light received from the second optical waveguide between a third optical waveguide and a fourth optical waveguide that pass along opposite sides of the passive ring filter, whereby the passive ring filter functions as a ring mirror that reflects the light received from the second optical waveguide back toward the RSOA to form the lasing cavity.

2. The optical transmitter of claim 1,
wherein the lasing cavity includes a thermo-optic coefficient (TOC) compensator comprising a section of compensation material;
wherein the lasing cavity includes a length $l_{Si}$ through silicon, a length $l_C$ through the compensation material, and a length $l_{OGM}$ through the optical gain material;

wherein the effective refractive index of silicon is $n_{Si}$, the effective refractive index of the compensation material is $n_C$, and the effective refractive index of the optical gain material is $n_{OGM}$;

wherein the effective TOC of silicon is $dn_{Si}/dT$, the effective TOC of the compensation material is $dn_C/dT$, and the effective TOC of the optical gain material is $dn_{OGM}/dT$; and wherein $l_C \approx l_{OGM}*(dn_{OGM}/dT - dn_{Si}/dT)/(dn_{Si}/dT - dn_C/dT)$, whereby the effective TOC of a portion of the lasing cavity that passes through the optical gain material and the compensation material is substantially the same as the TOC of silicon.

3. The optical transmitter of claim 1, wherein the RSOA is located on a III-V gain chip, which is separate from a silicon-on-insulator (SOI) chip that includes the ring modulator, the first and second optical waveguides, the passive ring filter and other components of the optical transmitter.

4. The optical transmitter of claim 1, wherein the ring modulator and the passive ring filter are both tuned to have resonances aligned with a Fabry-Pérot cavity mode within a gain bandwidth of the RSOA.

5. The tunable laser of claim 1, wherein the ring modulator and the passive ring filter include thermal tuning mechanisms.

6. A system, comprising:
at least one processor;
at least one memory coupled to the at least one processor; and
an optical transmitter for communicating optical signals generated by the system, wherein the optical transmitter includes:
a reflective semiconductor optical amplifier (RSOA);
a ring modulator that modulates an optical signal based on an electrical input signal;
a first optical waveguide with an input end and an output end, wherein the input end is coupled to the RSOA, the output end provides a transmitter output for the optical transmitter, and a section of the first optical waveguide between the input end and the output end is optically coupled to the ring modulator;
a second optical waveguide optically coupled to the ring modulator; and
a passive ring filter optically coupled to the second optical waveguide;
wherein the passive ring filter is connected to provide a mirror that reflects light received from the second optical waveguide back toward the RSOA to form a lasing cavity, wherein the lasing cavity includes the RSOA, the first optical waveguide, the ring modulator, the second optical waveguide and the passive ring filter;
wherein the ring modulator and the passive ring filter have different sizes, which causes a Vernier effect that provides a large wavelength tuning range for the lasing cavity in response to tuning the ring modulator and the passive ring filter; and
wherein the second optical waveguide is coupled to a Y-junction, which splits light received from the second optical waveguide between a third optical waveguide and a fourth optical waveguide that pass along opposite sides of the passive ring filter, whereby the passive ring filter functions as a ring mirror that reflects the light received from the second optical waveguide back toward the RSOA to form the lasing cavity.

7. The system of claim 6,
wherein the lasing cavity includes a thermo-optic coefficient (TOC) compensator comprising a section of compensation material;
wherein the lasing cavity includes a length $l_{Si}$ through silicon, a length $l_C$ through the compensation material, and a length $l_{OGM}$ through the optical gain material;
wherein the effective refractive index of silicon is $n_{Si}$, the effective refractive index of the compensation material is $n_C$, and the effective refractive index of the optical gain material is $n_{OGM}$;
wherein the effective TOC of silicon is $dn_{Si}/dT$, the effective TOC of the compensation material is $dn_C/dT$, and the effective TOC of the optical gain material is $dn_{OGM}/dT$; and
wherein $l_C \approx l_{OGM}*(dn_{OGM}/dT - dn_{Si}/dT)/(dn_{Si}/dT - dn_C/dT)$, whereby the effective TOC of a portion of the lasing cavity that passes through the optical gain material and the compensation material is substantially the same as the TOC of silicon.

8. The system of claim 6, wherein the RSOA is located on a III-V gain chip, which is separate from a silicon-on-insulator (SOI) chip that includes the ring modulator, the first and second optical waveguides, the passive ring filter and other components of the optical transmitter.

9. The system of claim 6, wherein the ring modulator and the passive ring filter are both tuned to have resonances aligned with a Fabry-Pérot cavity mode within a gain bandwidth of the RSOA.

10. The system of claim 6, wherein the ring modulator and the passive ring filter include thermal tuning mechanisms.

* * * * *

UNITED STATES PATENT AND TRADEMARK OFFICE
CERTIFICATE OF CORRECTION

PATENT NO.       : 10,162,199 B2
APPLICATION NO.  : 15/357358
DATED            : December 25, 2018
INVENTOR(S)      : Zheng et al.

It is certified that error appears in the above-identified patent and that said Letters Patent is hereby corrected as shown below:

In the Drawings

On sheet 4 of 7, in FIG. 3B, under Reference Numeral 350, Line 2, delete "TRANSMIITER" and insert -- TRANSMITTER --, therefor.

Signed and Sealed this
Fourteenth Day of January, 2020

Andrei Iancu
*Director of the United States Patent and Trademark Office*